United States Patent [19]
Macovski

[11] Patent Number: 5,274,331
[45] Date of Patent: Dec. 28, 1993

[54] MRI IMAGING SYSTEM USING A PERIODIC BIAS FIELD

[76] Inventor: Albert Macovski, 2505 Alpine Rd., Menlo Park, Calif. 94025

[21] Appl. No.: 884,756

[22] Filed: May 18, 1992

[51] Int. Cl.$^5$ ............................................. G01V 3/00
[52] U.S. Cl. ................................. 324/309; 324/307
[58] Field of Search ............... 324/309, 307, 300, 312, 324/314

[56] References Cited

U.S. PATENT DOCUMENTS 4,868,502  9/1989  Hanakawa et al. .............. 324/309
5,057,776  11/1991  Macovski ........................ 324/309

Primary Examiner—Louis Arana

[57] ABSTRACT

Signals from precessing magnetic moments are received in the presence of a cyclically varying bias field to avoid the phase error buildup due to inhomogeniety. The bias field has substantially a zero average value and can either use a pulse or a symmetrical waveform. The demodulating signal is based on the frequency of the cyclical variations.

17 Claims, 9 Drawing Sheets

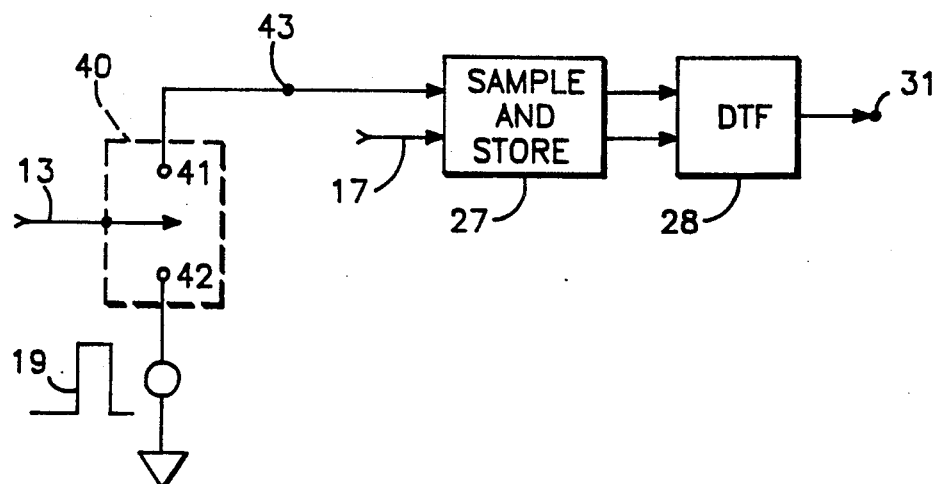
FIG.—4
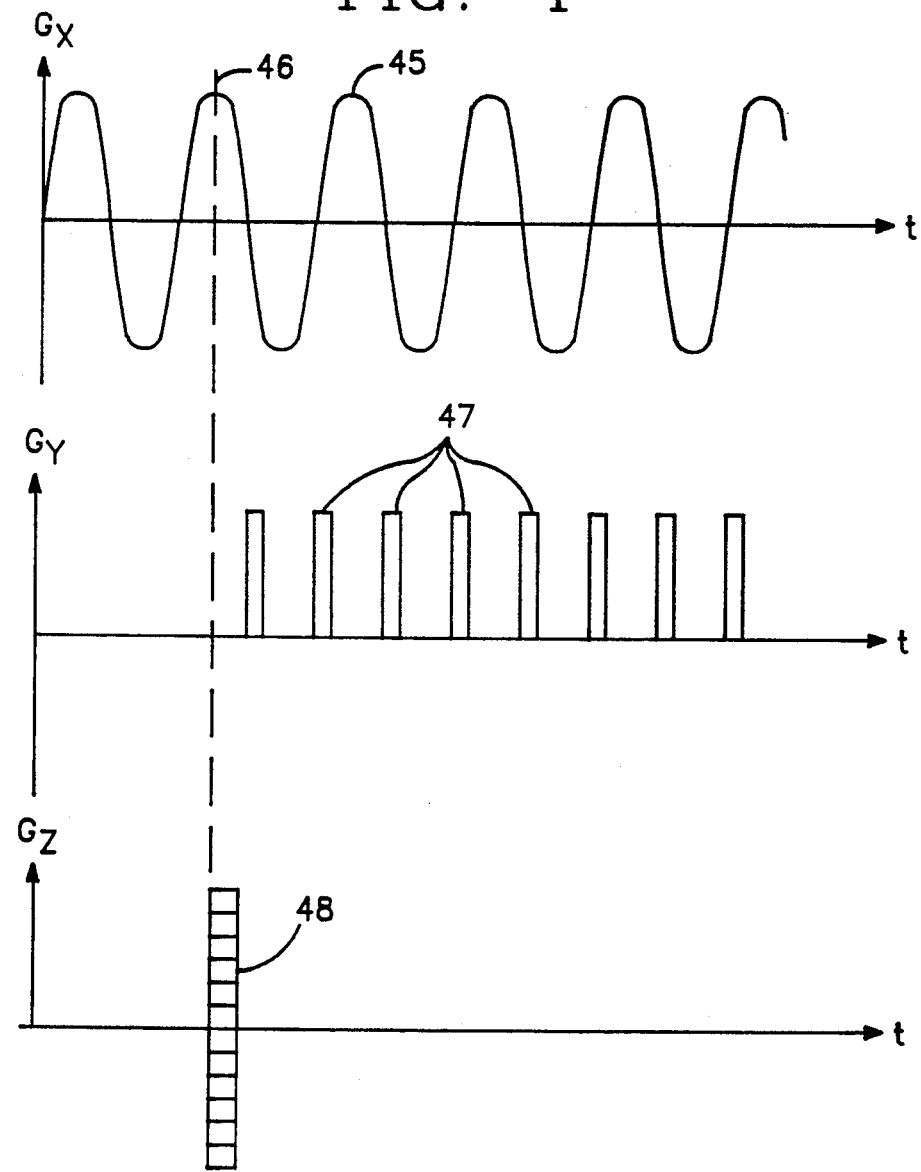
FIG.—5

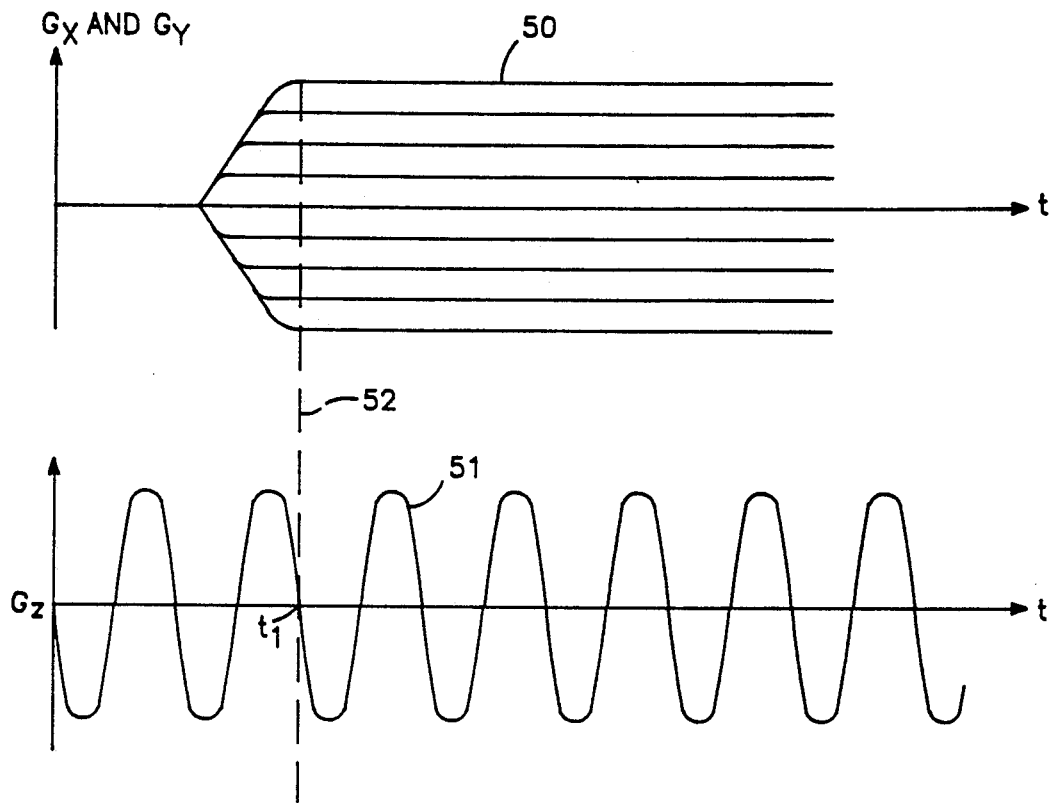
FIG.−6
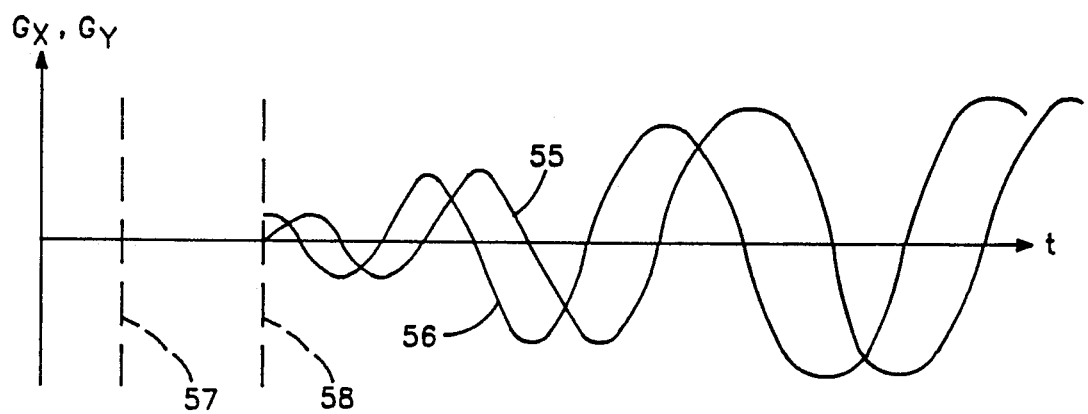
FIG.−7

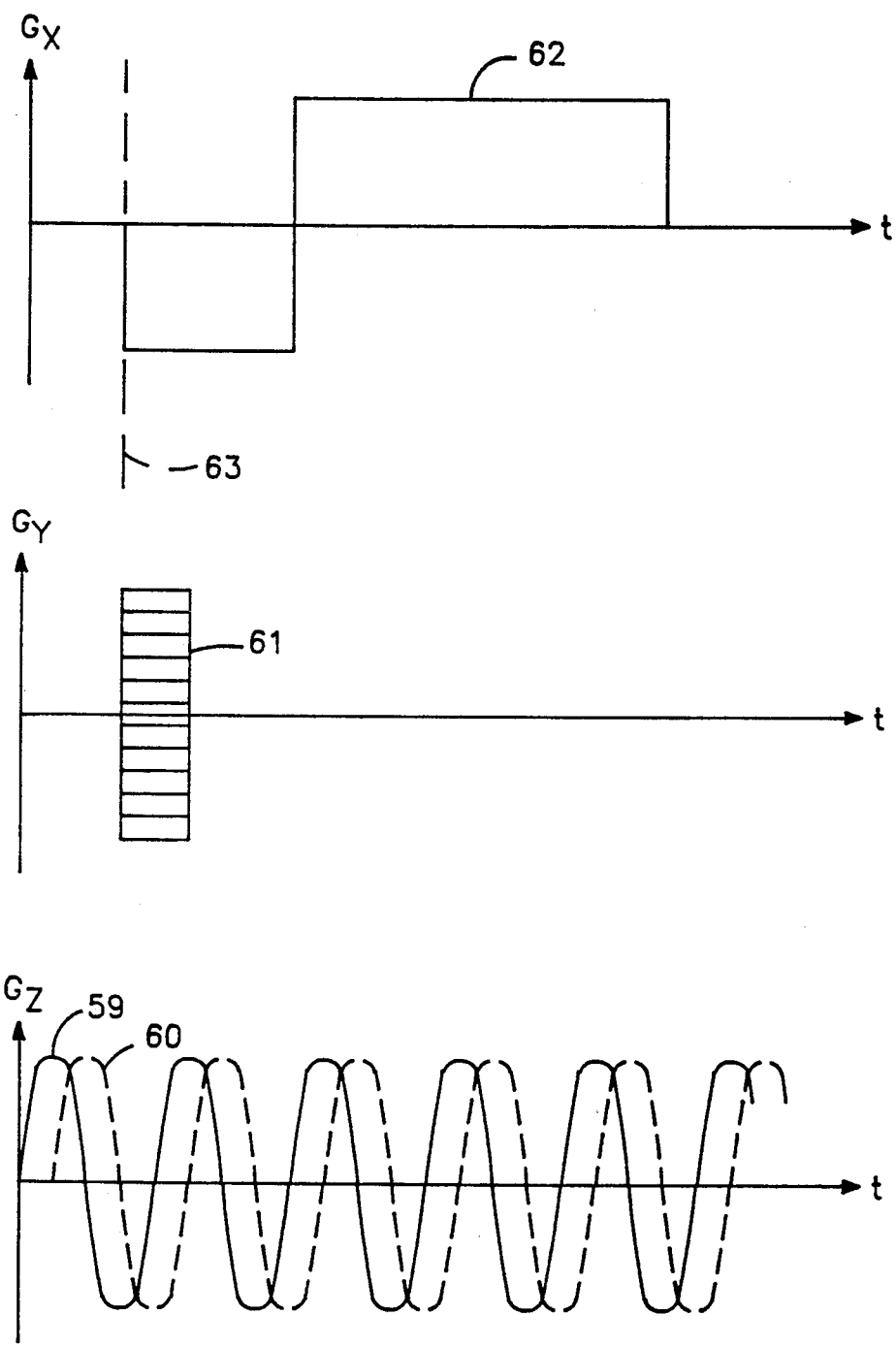
FIG.—8

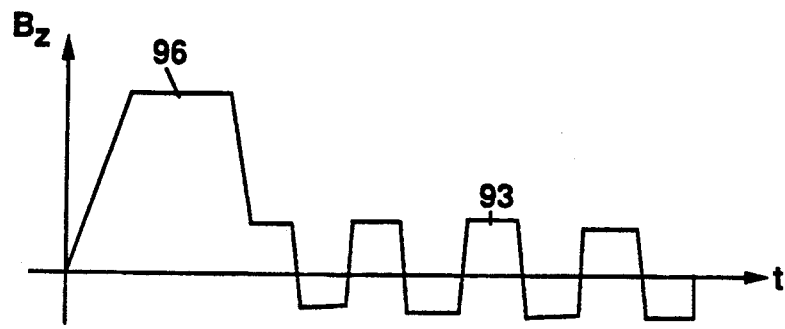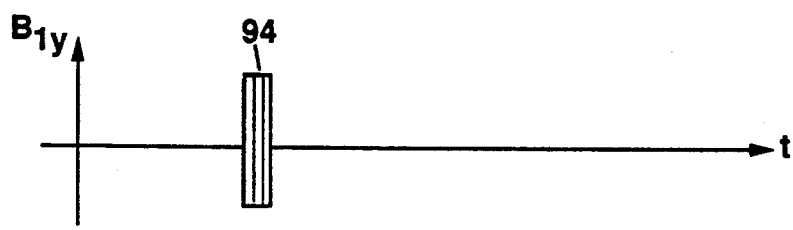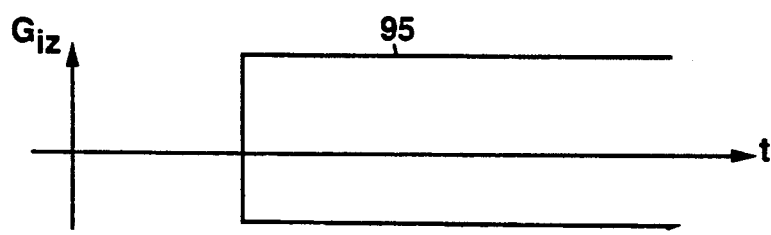
FIG. 13

MRI IMAGING SYSTEM USING A PERIODIC BIAS FIELD

1. FIELD OF THE INVENTION

This invention relates primarily to magnetic resonance imaging systems. In a primary application this invention relates to the use of a pulsed polarizing field followed by a cyclically varying bias field which determines the demodulating frequency independent of inhomogeniety.

2. DESCRIPTION OF PRIOR ART

Magnetic Resonance Imaging has become one of the wider-used modalities in the field of medical imaging. A descriptive series of papers on NMR imaging appeared in the June 1980 series of the IEEE Transactions on Nuclear Science, Vol. NS-27, pp 1220-1255. The basic concepts are covered in the lead article, "Introduction to the Principles of NMR" by W. V. House, pp. 1220-1226.

In general, in a MRI imaging system, the object being studied is within a highly-uniform intense static magnetic field. The object is then excited by a high-power radio frequency burst which causes the magnetic moments in the object, which were lined up with the static field, to precess normal to the static field. Using spatially orthogonal gradients, these magnetic moments become spatially varying. A receiver coil picks up the signals from the precessing moments. This signal is processed to create images of the magnetic moment density in the object.

These systems have a large number of theoretical and practical problems. The resulting costs are quite high since a highly uniform magnet is required over a relatively large volume. Also, a high-power radio frequency transmitter is required which must be uniformly distributed over the object and must avoid any excessive heating effects. Anything in the object which modifies the magnetic field, such as materials within the body which have changes in magnetic susceptibility, can seriously distort the image. Slightly differing magnetic resonances from different materials, primarily water and fat, become translated from each other, distorting the image. Also, many solid materials cannot be imaged since, in the presence of a strong polarizing field, the take on very short decay times. MRI machines cause loud sounds when the gradient coils are excited in the presence of a static magnetic field. Another practical difficulty with existing instruments is that high-power wide bandwidth amplifiers are required to run the gradient coils.

Efforts at increasing the SNR (signal-to-noise ratio) of NMR images usually involve increasing the magnetic field strength. However, in existing systems this ability is quite limited. If the field is increased, the r.f. excitation frequency must also be increased, greatly aggravating the r.f. heating problem. Also, the penetration of the r.f. signal on both the transmit and receive modes becomes a serious problem.

Perhaps the most important of the economics is that MRI, despite its almost ideal lack of toxicity and radiation, is not used for mass screening for any disease because of the prohibitive costs involved.

One attempt at a simpler system is given in a paper by J. Stepisnik, M. Kos, and V. Erzen in Proc. of XXII Congress Ampere, Roma, 512, 1986. Here the magnetic field is pulsed and then the magnetic moments are allowed to line up in the earth's field. Following this, an r.f. excitation is used to rotate the moments, with a set of gradients in the same direction as the earth's field used to create an image. This system has marginal performance, given the very weak gradients, and limited economic advantage, since r.f. excitation is required. A non-imaging system, without any r.f. excitation, was used to measure the earth's field using NMR. This system is described in Phys. Rev., A94, 941, (1954). Here a water sample is subjected to a pulsed field normal to the earth's field. The pulse is shaped so that the magnetic moments remain in the direction of the pulsed field when it turns off. Following the pulse, the precession frequency due to the earth's field is measured to determine the earth's field. This system used no gradients and did not provide imaging.

A novel approach approach to the use of a pulsed field is described in U.S. Pat. No. 5,057,776 issued to the applicant. Here a pulsed field is used to polarize the magnetic moments and is turned off in a manner to insure that the magnetic moments do not rotate. This is followed by a bias field and gradient fields pointing normal to the magnetic moments, thus causing precession without radio-frequency excitation. In some cases, where a relatively large bias field is desired to raise the demodulation frequency, the system will exhibit sensitivity to the inhomogeniety of this bias field. In many desirable configurations of magnetic resonance imagers, which provide patient comfort or are aimed at specific organs, the inhomogeniety will be relatively large and can cause problems.

A method of slice selection was introduced by the applicant in a recent U.S. patent application entitled PULSED FIELD MRI SYSTEM WITH SPATIAL SELECTION.

The methodology for using a cyclical bias field is related to that used in the copending application by the same inventor entitled ROTATING FRAME IMAGING SYSTEM. However, in that case the variations are used as modulation of a radio-frequency field in a rotating frame system.

SUMMARY OF THE INVENTION

An object of this invention is to produce MRI images of the body with immunity to variations in the magnetic fields.

A further object of this invention is to produce MRI images of the body without requiring radio-frequency excitation.

A further object of this invention is to produce MRI images without the distorting effects of magnetic susceptibility.

A further object of this invention is to provide greater control of the signal frequency in pulsed MRI systems.

Briefly, in accordance with the invention, a pulsed magnetic field is applied to a object to polarize the magnetic moments. A transverse bias field and gradient fields are applied to cause selective precession. The bias field is cyclically varied, with a zero average value, to prevent the buildup of phase errors, thus providing robust immunity to inhomogeniety. The resultant signals are demodulated using a signal based on the cyclical variation.

BRIEF DESCRIPTION OF THE DRAWINGS

FIG. 4 is a schematic diagram of an alternate embodiment of the invention;

FIGS. 5, 6, 7 and 8 are alternate embodiments of gradient waveforms used in the invention;

FIG. 13 is a set of graphs of an alternate embodiment of the invention using RF excitation.

DESCRIPTION OF THE PREFERRED EMBODIMENT

Figure 1:
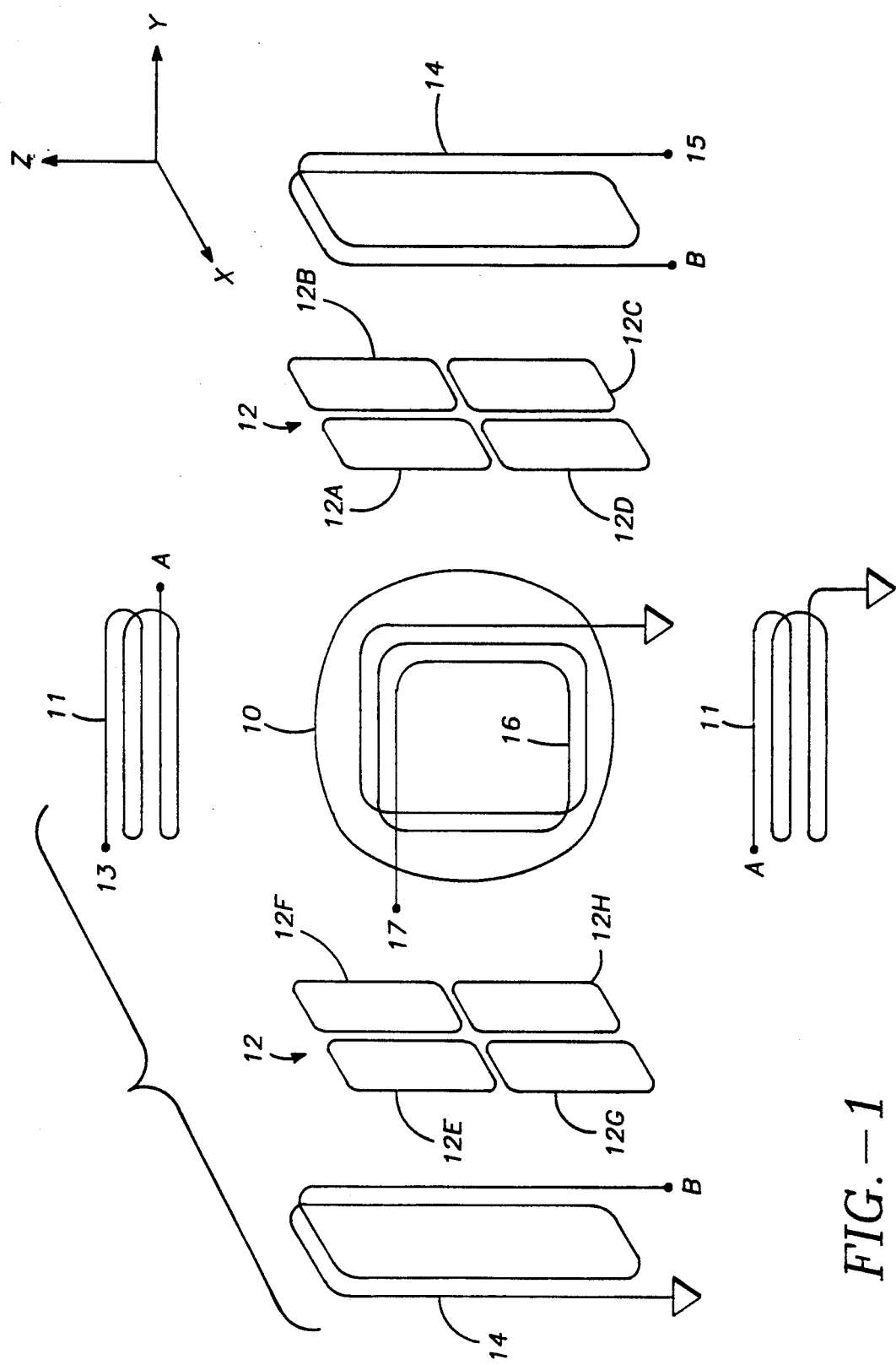
FIGS. 1, and 3, are schematic diagrams of an embodiment of the invention.

An understanding of the broad aspects of the invention may best be had by reference to FIG. 1. Here it is desired to create a magnetic resonance image of object 10, which is often a portion of the human body. In most MRI (magnetic resonance imaging) systems the object 10 would be immersed within an ultra-uniform static magnetic field, and have r.f. coils for the excitation of the magnetic moments. These expensive and critical components are not used in this invention. A pulsed magnetic field is used to polarize the magnetic moments in 10 by applying a current pulse to coils 11 where the upper and lower portion of coils 11 are series aiding, where terminals A are connected. This current pulse 19 is illustrated as the top graph in FIG. 2. The details of the pulse will subsequently be described. Following the pulse, the magnetic moments in 10 are polarized in the z direction. Following the pulse, gradient fields from gradient coils 12 and an oscillatory bias field from coils 14 create fields normal to the polarized moments, causing them to precess at frequencies determined by their relative positions in the spatially-varying gradient fields. These precessing moments are received by receiver coil 16 and processed to provide an image of object 10.

Figure 2:
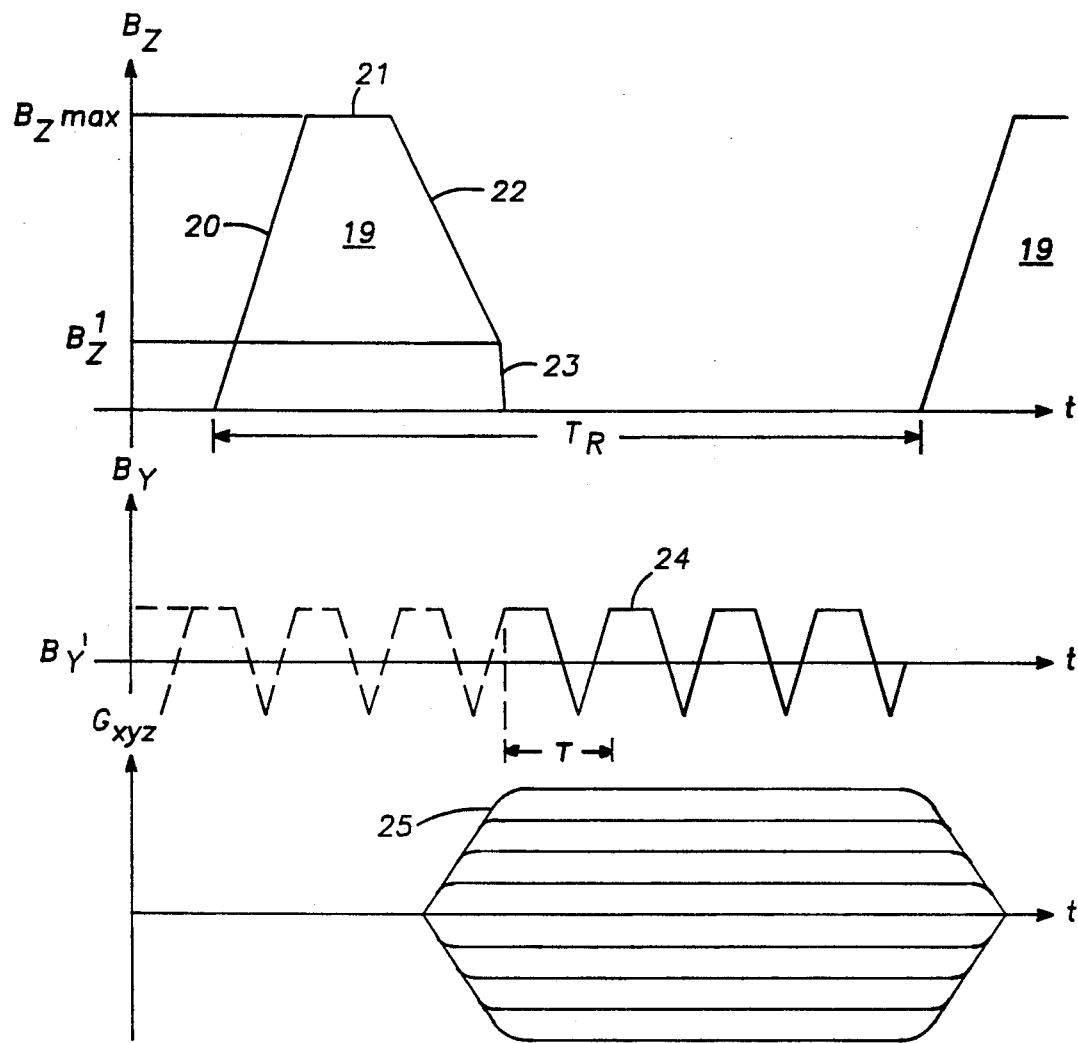
FIG. 2 is a set of graphs of signals used in an embodiment of the invention.

Referring to FIG. 2, the sequence is begun by creating the pulsed field 19 in 13, shown as $B_z$ in the top graph. The magnetic field is first increased, as shown in segment 20. The rate of increase $dB/dT$ is governed by a number of practical factors. These include the peak voltage across coil 13 and the maximum $dB/dT$ to avoid inducing excessive currents in the body, which is about 10-100 Tesla/second. The peak value Bz max, shown as 21, will determine the intensity of the magnetic moments, and therefore the resultant SNR. The duration of the pulse will partially determine the sensitivity of the resulting image to the $T_1$ recovery time, since longer $T_1$ species will reach a smaller fraction of their maximum value.

The more important region is the decay shown as segments 22 and 23. What is desired is that the magnetic moments point in the z direction until the gradients are applied, resulting in precession. If we assume no other fields present, this happens automatically. However, a variety of other fields can be present, including the earth's magnetic field. Also, it may be convenient to start some of the other fields, including $B_y$ and the gradient fields shown in FIG. 2, before the main pulse 19 ends. In this way they can be allowed to change slowly, or be on almost all the time, reducing the bandwidth and power requirements of the amplifiers. To accomplish these aims we first reduce the pulse amplitude adiabatically, where $dB/dT << \gamma B^2$ where $\gamma$ is the gyromagnetic ratio. This requirement, which is not critical, insures that the moments remain pointed in the direction of the net field, in this case the z direction. This adiabatic decay continues until we reach the field $B_z'$, a value substantially larger than the transverse magnetic field. The particular value used will depend on the transverse fields $B_y$ and the gradients which are on before pulse 19 terminates. From $B_z'$, on we insure that the pulse drops non-adiabatically, where $dB/dT >> \gamma B^2$. This insures that the moments remain pointed in the z direction and don't turn substantially in the direction of the transverse fields, but precess about them. As indicated, these requirements are not critical, and depend on the transverse fields present. If the time of segment 23 is short compared to $1/\gamma B_z'$, the moments will remain pointed in the z direction.

A periodic oscillatory transverse field $B_y$, shown as 24, is used in addition to the gradients. This field can be provided by the coils 14 in FIG. 1 where terminals B are connected to provide a series aiding configuration. These two coils on opposite sides of object 10 will provide a reasonably uniform field within the object. Thus signal 24 is connected to terminal 15 to energize coils 14. As shown in FIG. 2, Signal 24 can either be on during pulse 19, as shown in the dotted lines, or be turned on after pulse 19 ends and is turned off following the collection of data during the gradient sequence. If it is always left on, it makes pulse 19 somewhat more complex in that $B_z'$ is higher and the requirement for segment 23 to rapidly decay is somewhat more critical in insuring that the magnetic moments remain in the z direction. If it is turned on after pulse 19, as shown in the solid line, $B_z'$ can be reduced. An alternative to coils 14 is to derive the field $B_y$ using the same coils 12 as will be used for the gradient signals. Coil array 12 enables control of the gradients in all dimensions, as will be shown. However, if all eight coils are driven with the same signal, a reasonably uniform $B_y$ field will be produced, eliminating the need for coils 14.

The purpose of the $B_y$ field is to place all of the image information on a low-frequency carrier having a frequency determined by the periodicity of the $B_y$ field. As will be shown, this periodicity will be equal to or a sub-multiple of $\gamma B_y'$, where $B_y'$ is the field during the "trace" interval when the received signals are demodulated. This facilitates the demodulation of the image information. It also avoids the extremely low frequencies which might cause noise problems because of 60 hz power fields and the 1/f noise in active devices. This field, if made sufficiently high and were constant, could cause inhomogeniety problems. However, the use of a cyclical $B_y$ field, having a zero average value, provides a profound immunity to inhomogeniety. With constant bias fields differences in the magnetic field cause differences in the precession frequency. These result in a destructive buildup of phase differences, reducing the signal in the classical $T_2^*$ phenomenon. In this case, however, the phase differences are not allowed to build up. The "retrace" interval in $B_y$ causes the phases to return to their original lined up state, preventing the loss of signal. In general the minimum amplitude of $B_y'$ must exceed the largest field due to the gradients, which is GmaxXmax, the product of the largest gradient and the largest dimension of the object from the center. Typical values are about 0.5 gauss/cm for the maximum gradient and 15 cm as the maximum distance for a field of about 7.5 gauss. Using a $B_y'$ of 10 gauss, this represents a carrier frequency of 40 khz. The image signals will be distributed about this carrier frequency. A number of variations on the $B_y$ bias system will be presented.

The gradient requirements are essentially the same as a conventional MRI system using rf excitation. Thus a conventional gradient configuration can be used, where all of the fields, instead of being pointed in the direction of the $B_0$ field, are orthogonal to the pulsed polarizing field. As an illustrative embodiment of gradient fields coil configuration 12 contains 8 coils, each having individually controllable currents. As with conventional gradient systems these fields produce:

$$G_x = dB_y/dx$$

$$G_y = dB_y/dy$$

$$G_z = dB_y/dz$$

all pointed in the y direction. As with conventional MRI systems, these gradients represent a temporal scan through k-space where:

$$k_x(t) = \gamma \int G_x(t) \, dt$$

with the same formulation for $k_y$ and $k_z$ respectively. FIG. 2 shows one gradient embodiment where the 3D k-space is filled with an array of radial lines. For each value of one gradient, the other two go through all possible values. In this way the entire sphere of 3D k-space is sampled by the array of radial lines. The 3D object points can then be extracted by inverse Fourier transformation, or by projection reconstruction techniques, all well known. This is described by P. Lauterbur in Nature (London), 242, 190, (1973). As shown in FIG. 2, the gradient waveforms begin before pulse 19 ends. This simplifies the generation of these waveforms since they can have very slow rise-times corresponding to narrow bandwidths. This does, however, increase the burden on the pulse waveshape since the pulse must rapidly decay, in segment 23, for values representing the maximum gradient value plus the constant $B_p$, if used. If this represents a practical difficulty, the gradients can be initiated following the end of pulse 19, requiring more rapid gradients as are presently used. The entire sequence is repeated, using the appropriate gradients, at intervals $T_r$ as shown in FIG. 2.

Figure 3:
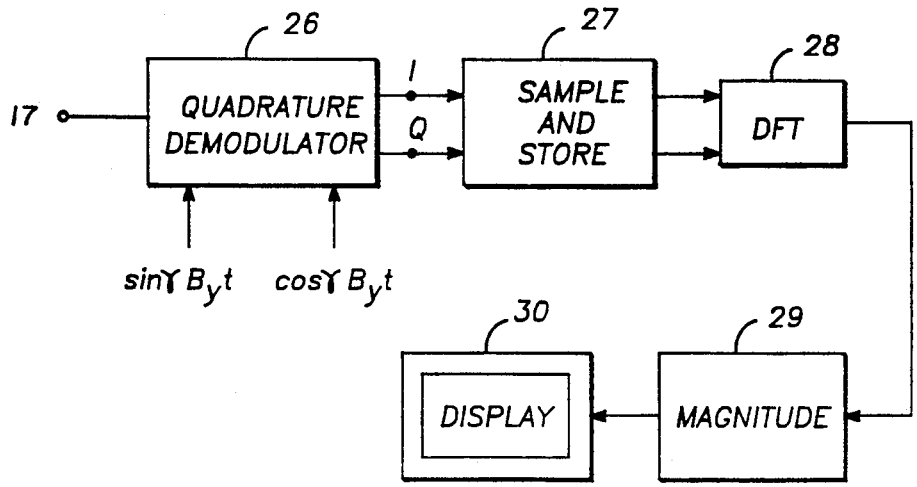

The receiver system is illustrated in FIG. 3. It begins with the pickup of the signals from object 10 in the presence of the gradients. The magnetic moments precess about the y axis, so that any coil having an axis normal to the y axis will receive the signal. For illustrative purposes, coil 16 is shown, having its axis in the x direction, receiving signals from the precessing moments in 10, with the signals from the total volume appearing at terminal 17. Coil 16 can represent either a classic array of N turns, with a signal $N d\phi/dt$, or can represent the coil of a SQUID detector or a Hall Effect detector where signal 17 is proportional to the flux $\phi$, rather than its derivative.

In any case the signal entering the quadrature demodulator, 26, during the trace interval of $B_y$, ignoring the retrace interval, will be a classic modulated carrier as given by:

$$s(t) = \int m(r) \exp(i\gamma B_y') \exp(i\, k(t) \cdot r) \, dr$$

Here it is assumed that the frequency $\gamma B_y'$ is approximately equal to the repetition waveform of the $B_y$ signal.

This signal is then quadrature demodulated in 26 producing two baseband signals I and Q, representing the real and imaginary part of k-space, or the spatial transform of the object 10. This is then sampled in 27, and stored based on the sequence used to scan k-space. The k-space values are then transformed in 28 to provide complex image signal 31. To display various aspects of the 3D image, it is convenient to take magnitude values in 29. Display 30 is used to display any cross section or projection of the 3D image values.

In addition to coil 16 being used for receiving the precessing moment signal, the pulser coils 11 can be used for receiving following the pulse since coils 11 are also in quadrature with the gradient fields. A switch can be used, as in switch 40 in FIG. 4, to first apply the pulse to coils 11 via terminal 13 by connecting the arm of switch 40 to position 42. Following the pulse, the switch is thrown to position 41, providing signal 43 which can be connected to the system of FIG. 3 by applying 43 to integrator 32. In this way a single coil is used for both pulsing and receiving. For improved SNR, both coils 11 and 16 can be used together by combining signals 17 and 43 in a 90~ phase shift network 44. This is done in existing MRI systems.

FIGS. 5, 6, and 7 are alternative gradient embodiments. As shown, as with FIG. 2, they represent k-space scanning over three dimensions. Three-dimensional scanning of k-space provides a considerable SNR advantage since signal is accumulated from each voxel for the entire imaging time. FIG. 5 shows one alternative using an echo-planer system. This system is described in the book "NMR IMaging in Biomedicine", by P. Mansfield and P. G. Morris, Academic Press, pp. 143-154. $G_x$ is a sinusoid 45 providing an oscillatory scan along the $k_x$ axis, although a square wave can also be used. Sinusoidal scans are desirable since resonant gradients can be used, as described in U.S. Pat. No. 4,639,671, Simultaneous NMR Imaging System by the same inventor. The sinusoidal scan is initiated at time 46 when pulse 19 terminates. Following each traverse of the $k_x$ axis a short pulse or blip, 47, is applies which advances one unit in $k_y$, providing a raster scan of the $k_x$-$k_y$ plane as is well known in echo planer systems. To cover all of k-space, a phase-encoding pulse is applied to $G_z$ to step an increasing distance in $k_z$ following each traverse of the $k_x$-$k_y$ plane. This approach is much faster than that of FIG. 2 since the entire $k_x$-$k_y$ plane is covered in each pulse excitation. Thus for N steps in $k_z$, the entire volume is covered in N pulses.

In FIG. 6 the $k_x$-$k_y$ axes are covered as in FIG. 2 with radial lines in k space resulting from constant gradients 50. The $k_z$ axis is scanned using sinusoid 51, which can be resonant for efficiency reasons. As with FIG. 5, the sinusoid can be started well before k-space scanning begins, or can be left on constantly, enabling the use of high Q resonant circuits, gain, as in FIG. 5, a square wave can be used for more uniform k-space coverage. This system is as fast as that of FIG. 5 in that a plane in k-space, parallel to and intersecting the $k_z$ axis, is covered during each excitation. An additional version of gradient waveforms is shown in FIG. 7. Here, pulse 19 ends at time 57, creating the precessing moments in object 10, but the scan of k-space isn't initiated until time 58. This can be done with any of the gradient systems described and provides image sensitivity to the $T_2$ relaxation parameter, which is known to be significant in images of the body. It is interesting to note that, with this system, it is not required to use the re-focusing properties of spin echoes. Merely waiting, or using gradient echoes is all that is required since inhomogeniety and chemical shift will not attenuate the precessing moment amplitude. Even if a relatively high $B_y$ bias field is used and is quite inhomogeneous, the oscillatory nature of the $B_y$ waveform will provide immunity to inhomogeniety. The waveforms shown in FIG. 7 will produce a spiral scan in the $k_x$-$k_y$ dimension in k-space. The waveforms are in quadrature phase. The preferred spiral has constant amplitude and decreasing frequency providing uniform coverage of k-space. For the $k_z$ axis, not shown in FIG. 7, we can use the phase encoding steps of FIG. 5, or the sinusoid of FIG. 6.

FIG. 8 is an alternate gradient configuration where the $k_x$-$k_y$ scan is identical to the 2DFT system in wide use in present systems. The sequence begins at time 63 when pulse 19 ends. Here different phase encoding steps 61 are applied to $G_y$ while $G_x$ first goes negative, thus moving to the most negative $k_x$ value, and then positive to scan the $k_x$ values while data is collected. Thus in the center of the positive portion of waveshape 62, the $k_x=0$ region will be traversed. This point will therefore determine the $T_2$ sensitivity of the image. For coverage of $k_z$, a sinusoid is shown. This can be a sinusoid whose frequency is at the sampling rate of the $k_x$ scan as in FIG. 6. This would be relatively high, requiring a relatively high amplitude. The frequency and power requirements can be reduced by using an interleaved system, where relatively course sampling is used on any one scan. This is followed by a sequence of identical scans where the sampling positions are moved, so as to sample the entire k-space. As shown in FIG. 8, $k_z$ waveform 59 is used on one scan, and 60 on another scan to fill in the samples in k-space. This same general approach can be used an any of the other gradient waveforms. The gradient requirements are reduced at the expense of a longer scanning interval.

The gradient systems shown are for scanning through the entire three-dimensional k-space. However, if two of the three gradient waveforms are used, with the third zero, information will be acquired representing a projection, through object 10, in the direction of the unused gradient. These images, comparable to conventional x-ray projection images, can be acquired in a much shorter time interval. Their disadvantage is that projection images have intervening structures which often obscure the structures of interest. This problem is overcome through the use of selective projection imaging which provides only the materials or structures of interest. One excellent example and application of selective projection imaging is vessel imaging where static material is cancelled and the resultant projection represents solely the moving blood. This concept was introduced in U.S. Pat. No. 4,528,985 by the same inventor. One approach which can be used is to provide two sets of excitations having identical k-space scans. On one, however, the gradient signal, prior to data collection, has a first moment different from that of the other, while their zeroth moments are identical. Thus when the two images are subtracted, the static tissue is cancelled and the flowing blood in vessels is visualized as an angiogram. Another approach is to subtract two identical sequences which are timed to occur at different phases of the cardiac cycle, representing differing flow velocities. A general overview of these approaches is given in a paper entitled, "Magnetic Resonance Angiography" by D. Nishimura et al, IEEE Transactions on Medical Imaging, MI-5, September 1986, pp 140–151. Many of the methods in this paper can be used to provide projection vessel images in this system. In addition to projection imaging of blood vessels, projections can be made to isolate other materials of interest by combining sets of image data representing different parameters such as $T_1$ and $T_2$. This process is described in U.S. Pat. No. 4,486,708 "Selective Material Projection Imaging System Using NMR" by the same inventor.

In the systems shown, following the gradient waveforms and the associated data acquisition, the residual magnetic moments in each voxel of the volume can be different. Therefore, the next polarizing pulse can result in a non-uniform moment distribution which can distort the resultant image. One solution to this problem is to make the time between pulses, $T_r$ in FIG. 1, long enough that the moments all decay to essentially zero. This can result in excessive imaging time for some studies. Another solution, not shown, but widely used is to provide additional gradient waveforms where the area of the gradient waveforms are made zero, so that the k-space scan returns to the origin, making the moment density uniform throughout the image.

The basic invention, over and above the prior art, is the use of the oscillatory bias signal $B_y$ which provides the desired immunity to inhomogeniety of the bias. The waveform 24 shown in FIG. 2 is one embodiment of the oscillatory bias signal. In the absence of gradient signals the phase of the precession is the integral of the $B_y$ waveform. For waveform 24, this will approximate a sawtooth with a trace interval having a linear phase increase of $2D\gamma B_y t$ and then a rapid retrace which returns the phase to its starting value as long as the area of negative excursion is equal to the positive area. As shown in FIG. 2. the waveform used in the retrace interval is ramped, to minimize the rapid change in magnetic field. This is appropriate since the linearity of the retrace interval is not significant. The frequency of the waveform is made approximately equal to the frequency corresponding to free precession at $\gamma B_y'$. The resultant received signal 17 goes through approximately a period of a sine wave during the trace interval, and then goes through a rapid distorted sine wave during the retrace interval. Signal 17 can be gated so as only to receive the signal during the trace interval of 24, and be off during the retrace interval. With this waveform the demodulator 26 in FIG. 2 is identical to that of a conventional I Q demodulator for a system with constant bias. If the waveform 17 during the trace interval is slightly more or less than a full period due to inhomogeniety, the output of the demodulator will change in a negligible fashion. The phase of signal 17 will depend on the gradient fields. Thus 17 will change from sine wave to cosine wave under different gradient conditions.

The rapid retrace requirement can make waveform 17 exceed the dB/dt limits based on neural responses. This can be further reduced by making each period of waveform 24 correspond to more than one cycle of the received precessional signal. Thus we make the frequency of 24, 1/T equal to approximately $\gamma B_y'/n$ where n is the number of cycles in each period of $B_y$. This allows the retrace interval to be longer, and thus have reduced dB/dt, since it now represents a portion of many cycles. The sensitivity to inhomogeniety will be somewhat increased, although will remain at a negligible level. If the retrace interval becomes significantly long it may be desirable to turn off the gradients during the retrace to avoid missing a significant portion of the k-space scan.

Figure 9:
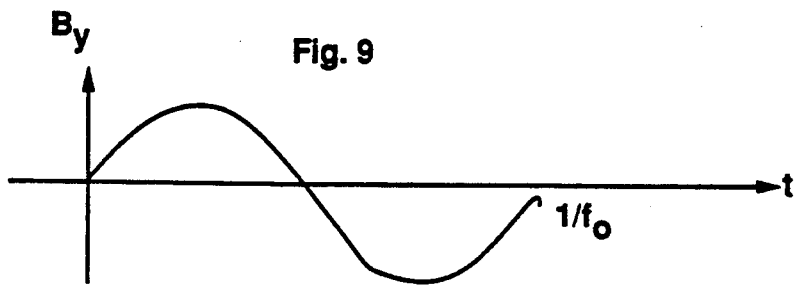
FIG. 9 shows a sinusoidal bias waveform in the invention.

FIGS. 9 and 10 show alternate embodiments of the oscillatory $B_y$ bias signal. In general, any periodic waveform with a zero average value can serve as a homogeniety independent bias waveform. The choice of waveform therefore depends on such things as the resultant dB/dt, and the SNR resulting from the recovered signal. FIG. 9 shows a sinusoidal bias waveform. These are relatively easy to generate using resonant circuits. The waveform has a peak value of $B_{yp}$ and a frequency $f_0$. The resultant received signal 17, in the absence of gradients, is a sinusoidal frequency modulated signal. This can be decomposed into an array of Bessel functions of the first kind, each with argument $\gamma B_{yp}/2\pi f_0$. The fundamental frequency $f_0$ is generated by the $J_0$ component of the Bessel function expansion. The demodulation can be the same as in FIG. 3 with the frequencies of the sine and cosine demodulation signals replaced replaced by $f_0$, the frequency of $B_y$. This system will have poorer SNR than that of FIG. 2 because the $J_0$ component, representing the fundamental frequency, is reduced as compared to full modulation. The higher harmonics at each $J_n$, can also be used by having either additional quadrature demodulators operating at harmonics of $f_0$, or having the demodulation signals be sums of the fundamental and harmonics of $f_0$.

Figure 10A:
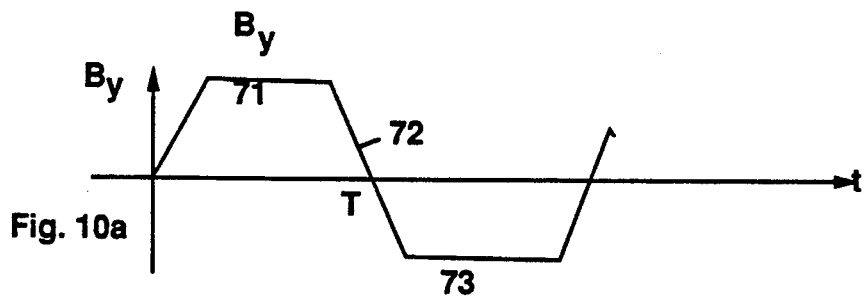
FIG. 10a shows a square-wave type of bias waveform used in the invention.
Figure 10B:
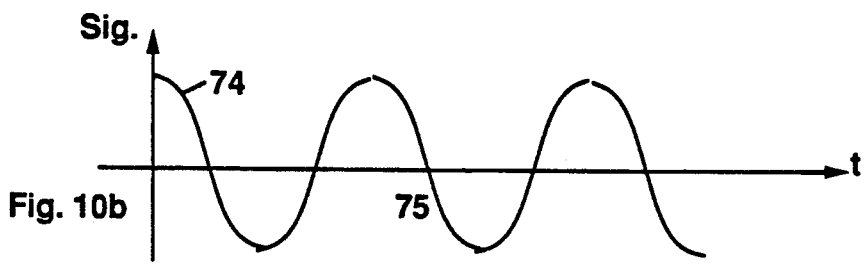
FIG. 10b shows a cosinusoidal received signal resulting from the square-wave bias waveform.
Figure 10C:
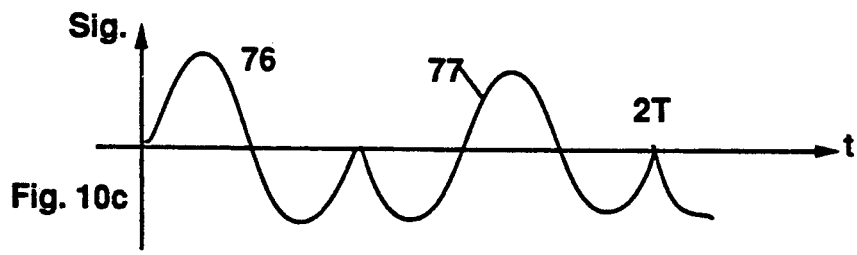
FIG. 10c shows a sinusoidal received signal resulting from the square-wave bias waveform.

FIG. 10a shows an alternate embodiment using a square wave. This signal can be used and demodulated in the same way as the sinusoid. Preferably, however, it can be used in a manner to provide improved SNR. Here each half period T is used to provide a full cycle of the carrier frequency which is approximately $\gamma B_y'$. Thus the positive period 71 results in the carrier phase advancing a full cycle while the negative period 73 results in the carrier phase retarding by a full cycle. This results in the waveforms shown in FIGS. 10b and 10c. In FIG. 10b the carrier signal starts at a maximum, as represented by a cosine signal 74. When the square wave reverses, the rewinding operation produces signal 75, which is an identical cosine wave. In FIG. 10c the carrier signal starts at zero, as represented by a sine signal 76. Here, when the square wave reverses, the sine wave itself reverses as shown in 77. Thus the rewinding operation reverses the polarity with a sine signal.

Figure 11:
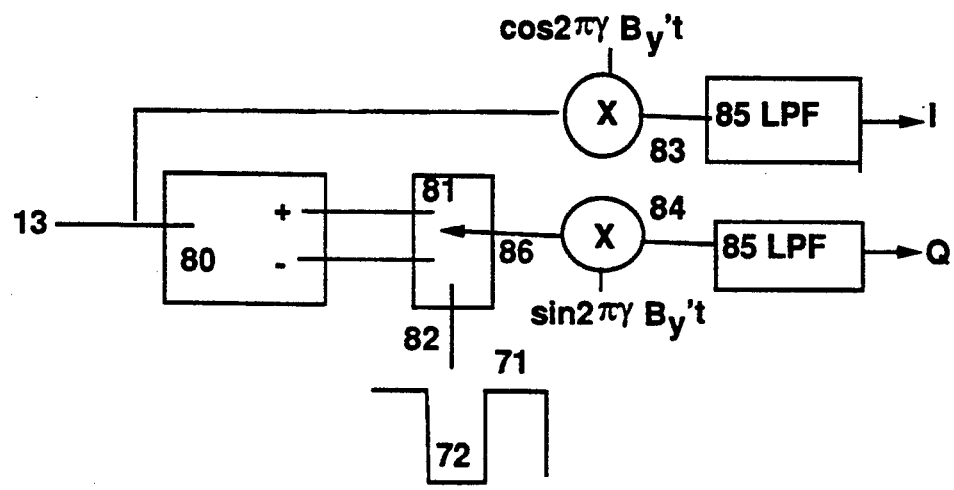
FIG. 11 is an alternate embodiment of a demodulation system.

The demodulation of these signals is shown in FIG. 11. Here signal 17 is first supplied to phase splitter 80 which creates positive and negative versions of the received signal. The positive and negative outputs are applied to controlled switch 81 which is toggled by waveform 82, the square wave of FIG. 10a. The positive output is applied directly to multiplier 83 which multiplies signal 17 by the synchronous demodulating signal $\cos(2\pi\gamma B_y't)$ to extract the cosine portion of the received signal. This is followed by low pass filter 85 which removes the undesired high frequency component to form the I signal representing the in-phase or real part of the Fourier transform. Toggled signal 86 represents the polarity reversed version of signal 17. It is applied to multiplier 84 which multiplies 86 by $\sin(2\pi\gamma B_y't)$ to extract the sinusoidal component. This is again followed by low pass filter 85 to provide the quadrature or Q signal representing the imaginary parts of the Fourier transform of object 10. The approach of FIGS. 9 and 10 enables a more complete recovery of the modulated signal, providing higher SNR. It can be used with any symmetric waveform including the sinusoid of FIG. 9.

To avoid excessive dB/dt in the square wave of FIG. 10, the sloped portion 72 must be given sufficient time. As with the waveform 24 of FIG. 2 this interval may represent an excessive portion of the square wave. In that case, as previously discussed, the period T can be designed to cover a number of cycles of the bias frequency where $1/T=\gamma B_y'/n$. In that case, demodulators 83 and 84 will also be operated at frequencies of $\gamma B_y'$.

Figure 12A:
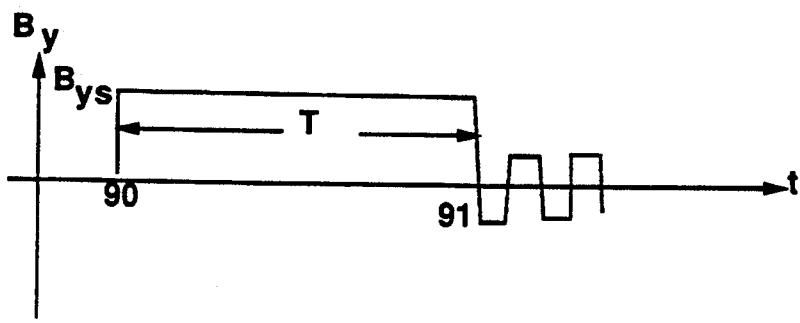
FIG. 12a is a graph of a bias waveform used in the separation of water and fat.
Figure 12B:
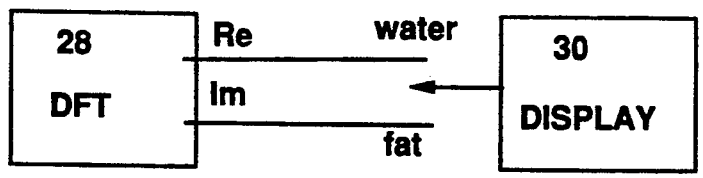
FIG. 12b is block diagram of a processor for separating water and fat.

In general the system as described will measure the total magnetic moment density of all species in the water spectrum, including both water and fat. These will not be distinguished since the oscillating bias will lock both the water and fat signals to the oscillation frequency. In some cases, however, it is desired to separate the water and fat distributions. This can be done as shown in FIG. 12 by including a period of time T without the oscillating bias signal, allowing the water and fat signals to separate in phase by 90 degrees. As shown in FIG. 12a, following the initiation of spin precession, at time 90, a constant $B_y$ bias $B_{ys}$ is used to cause the water and fat to precess at different frequencies. The time T used is $\frac{1}{4}$ period of the water and fat difference frequency $(\gamma_w-\gamma_f)B_{ys}$. Following this period, at time 91, one of the cyclical bias fields previously described, such as the square wave shown, are applied during the time the gradients are applied and signals are received. To separate the two images, the real and imaginary parts of the transformed image coming out of DFT 28 are used. Here switch 92 is used to switch either the real or imaginary part to display 30.

The system as described thusfar used the oscillating bias field and gradient fields pointing in the y direction, or in quadrature with the pulsed polarizing field. This is an attractive embodiment, avoiding the use of rf excitation. However, many other embodiments can be used with the new concept of an oscillating bias field. For example, the gradient and bias fields can point in the z direction, thus requiring an rf excitation field to initiate precession as shown in FIG. 13. Here polarizing pulse 96 is followed by oscillating bias field 93 during the readout interval, all applied to coils 11. RF excitation pulse 94, representing $B_{1y}$ in the y direction, is applied, for example, to coils 11. The gradients $G_{iz}$, 95, are fields in the z direction with variations in each axis. Thus the axes of coils 12 is moved to the z axis. The specific waveforms are any of those previously shown in FIGS. 3,5,6,7 and 8. Following the excitation the receiving operation, in the presence of the bias and gradient fields, is the same as previously described with the same variety of bias and gradient waveforms. Thus the system is essentially the same as existing MRI systems with the one exception of the $B_z$ field. Here, instead of the usual constant $B_0$ field, we use a pulse followed by an oscillating bias field. In this case there is no need for the non-adiabatic portion of the pulse 23, The pulse simply ends, with the same slope, and the oscillating portion begins.

All of the vessel imaging approaches and pulse generating approaches shown in previously referenced U.S. Pat. No. 5,057,776 can be applied to this system utilizing an oscillating bias field, with the subsequent profound immunity to inhomogeniety. This can be very important in creating a variety of novel MRI configurations including portable machines which are wheeled to a bedside or special purpose machines for imaging specific organs.

Although the system as described is for imaging, the same system could be used in non-imaging instruments to measure the signal from a sample. In that case the gradients would not be used.

I claim:

1. In a method for imaging the magnetic spin density in an object the steps of:
    polarizing the magnetic moments in the object;
    applying gradient fields and a substantially spatially uniform cyclical bias field having substantially a substantially spatially uniform zero average value;
    causing the magnetic moments to precess;
    receiving signals from the precessing magnetic moments;
    demodulating the received signals using demodulation signals; and
    processing the demodulated received signals to produce an image of the magnetic spins in the object.

2. The method as described in claim 1 where the step of polarizing the magnetic moments includes the step of applying a pulsed magnetic field to the object.

3. The method as described in claim 2 where the step of applying the gradient fields and the bias field to the object includes the step of applying the gradient fields and bias field in spatial quadrature to the pulsed magnetic field.

4. The method as described in claim 1 where the step of demodulating the received signals includes the step of deriving the frequency of the demodulation signals from the frequency of the cyclical bias field.

5. Apparatus for imaging the magnetic spin density in an object comprising:
    means for polarizing the magnetic moments in the object;
    means for applying gradient fields and a cyclical bias field having substantially a zero average value during the time signals are received;
    means for causing the magnetic moments to precess;
    means for receiving signals from the precessing magnetic moments;
    means for demodulating the received signals using demodulation signals; and
    means for processing the demodulated received signals to produce an image of the magnetic spins in the object.

6. Apparatus as described in claim 5 where the cyclical bias field is a pulsed field having a trace period during which the received signals are acquired and a retrace period, of opposite polarity and substantially shorter duration.

7. Apparatus as described in claim 6 where the frequency of the pulsed bias field is substantially equal to the gyromagnetic constant multiplied by the value of the bias field during the trace period.

8. Apparatus as described in claim 6 where the frequency of the pulsed bias field is substantially equal to a submultiple of the gyromagnetic constant multiplied by the value of the bias field during the trace period.

9. Apparatus as described in claim 5 where the cyclical bias field is a symmetrical waveform spending substantially equal time periods in each polarity.

10. Apparatus as described in claim 9 where the cyclical bias field is substantially a sine wave.

11. Apparatus as described in claim 9 where the cyclical bias field is substantially a square wave.

12. Apparatus as described in claim 9 where the processing means includes polarity switching means for obtaining opposite polarities of the received signal during each half of the square wave and means for demodulating the polarity switched signal and the received signal using demodulating signals in quadrature phase.

13. Apparatus as described in claim 5 where the frequency of the demodulating signals are substantially equal to the frequency of the cyclical bias field.

14. Apparatus as described in claim 5 where the frequency of the demodulating signals are substantially equal to a multiple of the frequency of the cyclical bias field.

15. Apparatus as described in claim 5 including means for applying a static bias field for substantially a quarter of the period of time corresponding to the period represented by the difference of the gyromagnetic ratios of water and fat multiplied by the static bias field and where the processing means includes means for separating the demodulated received signals corresponding to water and fat.

16. Apparatus as described in claim 5 where the polarizing means, gradient fields and the cyclical bias fields all point in a first direction, and including a pulsed rf field pointing normal to the first direction which follows the polarizing means to initiate precession.

17. In a method for deriving spin-density information from precessing magnetic moments in an object with substantial immunity to inhomogeniety the steps of:
    applying a cyclically-varying bias field having substantially zero average value normal to the axis of the precessing moments;
    receiving signals from the precessing moments in the presence of the cyclical bias field; and
    demodulating the received signals using a demodulation signal based on the cyclically-varying bias field.

* * * * *